(12) United States Patent
Chang

(10) Patent No.: US 6,246,088 B1
(45) Date of Patent: Jun. 12, 2001

(54) NONVOLATILE MEMORY CIRCUIT AND STRUCTURE

(75) Inventor: Kuo-Tung Chang, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/439,209

(22) Filed: May 11, 1995

Related U.S. Application Data

(62) Division of application No. 08/262,167, filed on Jun. 20, 1994, now Pat. No. 5,498,559.

(51) Int. Cl.[7] .......................... H01L 29/76; H01L 29/788
(52) U.S. Cl. .......................... 257/314; 257/315; 257/316; 257/319; 257/320
(58) Field of Search .................................. 257/314, 315, 257/316, 318, 319, 320

(56) References Cited

U.S. PATENT DOCUMENTS

| | | | |
|---|---|---|---|
| 5,194,925 | 3/1993 | Ajika et al. | 257/314 |
| 5,225,362 | 7/1993 | Bergemont | 438/261 |
| 5,268,319 | 12/1993 | Harari | 438/260 |
| 5,278,087 | 1/1994 | Jenq | 438/594 |
| 5,278,439 | 1/1994 | Ma et al. | 257/319 |

*Primary Examiner*—Eddie Lee
*Assistant Examiner*—George C. Eckert, II
(74) *Attorney, Agent, or Firm*—George R. Meyer; Robert A. Rodriguez

(57) ABSTRACT

A nonvolatile memory includes five transistors. The memory has an MOS transistor in series with two pairs of transistors, where each pair includes a floating gate transistor and a metal-oxide-semiconductor transistor electrically connected in parallel. The memory structure may be formed with three levels of silicon-containing or metal-containing layers. The memory structure is less susceptible to read disturb errors compared to a prior art dual-bit nonvolatile memory structure.

8 Claims, 3 Drawing Sheets

NONVOLATILE MEMORY CIRCUIT AND STRUCTURE

This is a divisional of patent application Ser. No. 08/262,167, filed Jun. 20, 1994 U.S. Pat. No. 5,498,559.

FIELD OF THE INVENTION

The present invention relates to the field of semiconductor devices, and in particular, to semiconductor devices having nonvolatile memory structures.

BACKGROUND OF THE INVENTION

A dual-bit nonvolatile memory structure may include three transistors, a first floating gate transistor, a second floating gate transistor, and the other is a select gate transistor. The two floating gate transistors are formed over portions of a common channel region. The floating gates for the two floating gate transistors extend completely across all of the channel region in at least one direction between field isolation regions. The first floating gate transistor is connected to a first bit line, and the second floating gate transistor is connected to a second bit line.

The dual-bit memory structure may have problems related to read disturb. For example, the data in the second floating gate transistor is to be read. The first bit line is grounded and the second bit line at a potential of about one volt. The state of the bit is determined by a sense amplifier that is connected to the second bit line. The control gate of the first floating gate transistor and the select gate are placed at relatively high potentials (about five volts or higher), so that electrons may flow beneath the first floating gate and select gate. The control gate of the second floating gate transistor is grounded during the read operation. Electrons may be injected into the floating gate of the first floating gate transistor while the second floating gate transistor is read. In other words, electrons within the channel under the first floating gate transistor may be pulled into the floating gate by the high potential on the control gate of the first floating gate transistor. If the first floating gate transistor is programmed to have a threshold voltage −2 volts, the reading of the second floating gate transistor typically will increase the threshold voltage of the first floating gate transistor as electrons are injected into the floating gate of the first floating gate transistor. Data in the first floating gate transistor may not be determined by a sense amplifier because it is at a state between being programmed and erased, or the data may be inverted, in which case the data in the floating gate does not correspond to the data originally programmed into it. Data disturb problems in any type of memory cell are undesired.

SUMMARY OF THE INVENTION

The present invention includes a nonvolatile memory circuit, a nonvolatile memory structure, and the process for forming the structure. The nonvolatile memory circuit is for storing a plurality of bits of data and comprises first, second, third, fourth, and fifth transistors. The first transistor has a gate, a first source/drain, and a second source/drain, and the second transistor has a control gate, a floating gate, a first source/drain, and a second source/drain. The first source/drains of the first and second transistors are coupled to each other, and the gate of the first transistor and the control gate of the second transistor are coupled to each other. The third transistor has a gate, a first source/drain, and a second source/drain. The second source/drain regions of the first and second transistors and the first source/drain region of the third transistor are coupled to each other. The fourth transistor has a control gate, a floating gate, a first source/drain, and a second source/drain, and the fifth transistor has a gate, a first source/drain, and a second source/drain. The first source/drains of the fourth and fifth transistors are coupled to each other. The second source/drain regions of the third, fourth and fifth transistors are coupled to one another. The control gate of the fourth transistor and the gate of the fifth transistor are coupled to each other.

The present invention may also include a nonvolatile memory structure for storing a plurality of bits of data that comprises a semiconductor substrate, a first doped region and a second doped region, a channel region, a first gate dielectric layer, a first floating gate and a second floating gate, an intergate dielectric layer, a first conductive member and a second conductive member, and a third conductive member. The semiconductor substrate has a first conductivity type. The first and second doped regions lie within the substrate and are spaced apart from each other. The channel region lies within the substrate and between the first and second doped regions. The first gate dielectric layer and the first and second floating gates overlie the substrate. The first and second floating gates are spaced-apart from each other and do not extend across all of the channel region in any direction. The intergate dielectric layer overlies the first and second floating gates. The first conductive member lies adjacent to the first floating gate and overlies a first portion of the channel region that is not covered by the first or second floating gates. The second conductive member lies adjacent to the second floating gate and overlies a second portion of the channel region that is not covered by the first or second floating gates. The first and second conductive members are spaced apart from each other. The third conductive member overlies a third portion of the channel region that lies between the first and second conductive members. The present invention also includes a process for forming the memory structure.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF EMBODIMENTS

A split-channel nonvolatile memory includes five transistors and three levels of silicon-containing and/or metal-containing layers. The memory is less susceptible to read disturb errors compared to prior art dual-bit nonvolatile memories. The present invention is better understood with the embodiments described below.

Split-Channel Nonvolatile Memory

Figure 1:
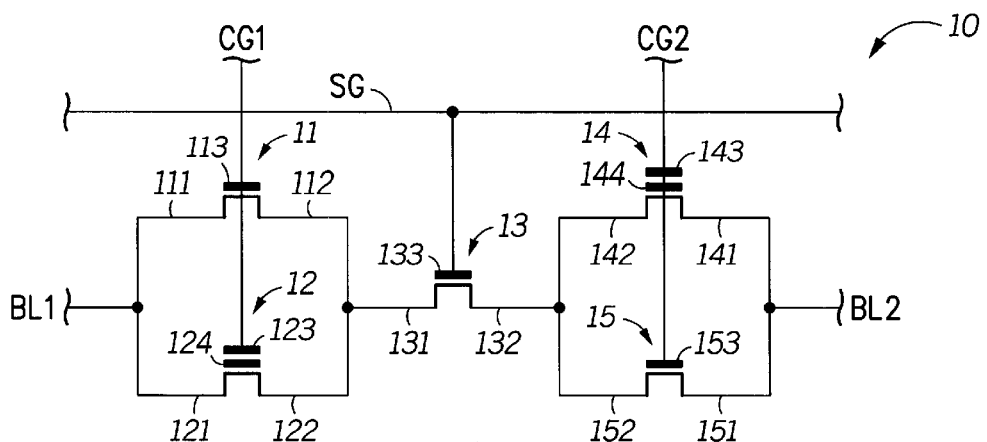
FIG. 1 includes a circuit diagram of a split-channel nonvolatile memory.

FIG. 1 includes a circuit diagram of a portion of a split channel nonvolatile memory circuit 10. Included within the memory are two bit lines BL1 and BL2 that make direct access to the nonvolatile memory circuit 10 that has five transistors 11–15. Of these five transistors, transistors 12 and 14 are floating gate transistors. The other three transistors 11, 13, and 15 are metal-oxide-semiconductor (MOS) transistors. The split channel nonvolatile memory circuit 10 is capable of storing two bits of data.

Transistor 11 includes a first source/drain 111, a second source/drain 112, and a gate 113; and transistor 12 includes a first source/drain 121, a second source/drain 122, a control gate 123, and a floating gate 124. A first bit line BL1 and the first source/drains 111 and 121 are coupled to one another. The control gates 113 and 123 are part of a first control gate line CG1. Transistor 13 includes a first source/drain 131, a second source/drain, 132 and a gate 133. The first source/drain 131 and second source/drains 112 and 122 are coupled to one another. The gate 133 is part of a select gate line SG. Transistor 14 includes a first source/drain 141, a second source/drain 142, a control gate 143, and a floating gate 144; transistor 15 includes a first source/drain 151, a second source/drain 152, a control gate 153, and a floating gate 154. A second bit line BL2 and the first source/drains 141 and 151 are coupled to one another. The second source/drain regions 132, 142, and 152 are coupled to one another. The control gates 143 and 153 are part of a second control gate line CG2. In one embodiment, electrical connections may be used as a specific type of coupling. For example, BL1 and first source/drains 111 and 121 are electrically connected to one another, the first source/drain 131 and second source/drains 112 and 122 are electrically connected to one another, etc.

Figure 2:
FIG. 2 includes a cross-sectional view of a portion of a substrate after forming a floating gate layer.
Figure 3:
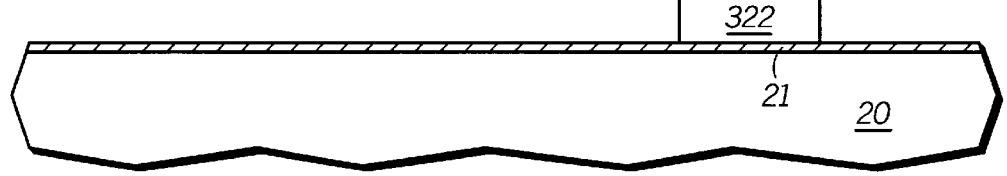
FIGS. 3 and 4 include a cross-sectional view and a plan view, respectively, of the substrate of FIG. 2 after the floating gates have been formed.

Formation of a nonvolatile memory structure will be described that corresponds to the circuit diagram of FIG. 1. FIG. 2 includes an illustration of a portion of a semiconductor substrate 20, a tunneling dielectric layer 21, a silicon-containing layer 22, an oxide layer 23, and a nitride layer 24. Layers 22–24 are patterned as shown in FIGS. 3 and 4 to form structures including floating gates 321 and 322, oxide members 33, and nitride members 34.

Figure 4:
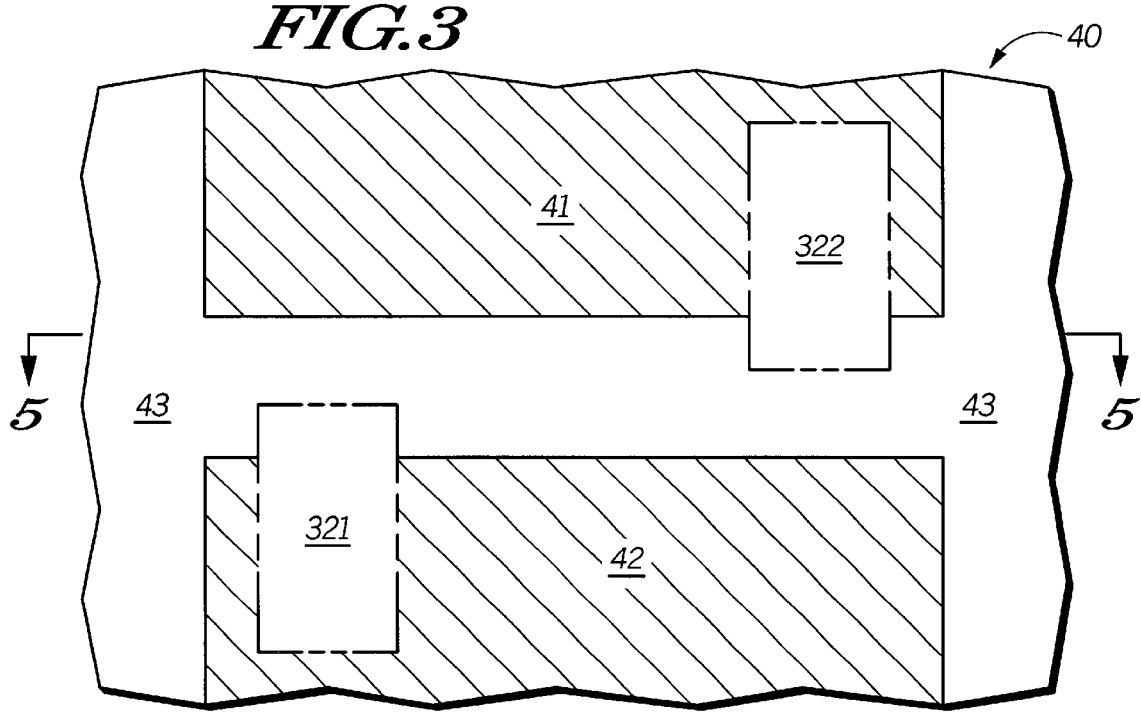

FIG. 4 includes a plan view of the location of where the nonvolatile memory structure 40 is being formed. The floating gates 321 and 322 are shown in FIG. 4 to illustrate their positional relationships between themselves, field isolation regions 41 and 42, and active region 43. The oxide and nitride members 33 and 34 are not shown in FIG. 4 to simplify understanding of the positional relationships. Both the floating gates 321 and 322 are relatively conductive members, but do not extend across all of the active regions 43 in any direction. The active region 43 is defined by the field isolation regions 41 and 42. A channel region will be formed from a portion of the active region 43 that lies beneath or between the floating gates 321 and 322. Compare this to a prior art dual-bit memory cell in which the floating gates completely extend across all of the channel region in at least one direction. In other words, the floating gates of the dual-bit memory structure extend from field isolation region 41 to field isolation region 42.

Figure 5:
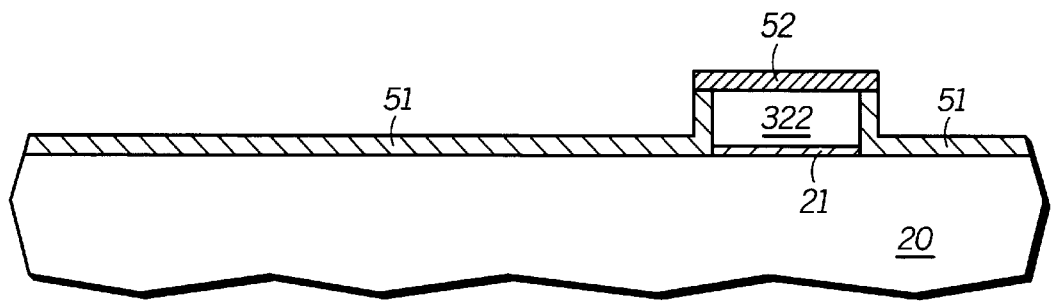
FIG. 5 includes a cross-sectional view of the substrate of FIG. 3 after forming an intergate dielectric layer.

A gate dielectric layer 51 is formed along exposed portions of the substrate 20 and floating gates 321 and 322 as shown in FIG. 5. The gate dielectric layer 51 is formed by thermal oxidation. A portion of the silicon nitride members 34 are oxidized. The oxidation of the nitride members 34 forms oxide-nitride-oxide (ONO) stacks 52 over the floating gates 321 and 322, and each ONO stack 52 includes the oxide and nitride members 33 and 34. In alternate embodiments, an ONO stack 52 may not be formed. For example, the oxide and nitride layers 23 and 24 may not be formed. After patterning layer 22, the gate dielectric layer 51 may cover the tops and sides of the floating gates 321 and 322. In still another embodiment, oxide-nitride-oxide layers may be formed over the substrate 10 and along the tops and sides of the floating gates 321 and 322. In yet another embodiment, a nitrided oxide may be formed. Formation of these layers of the various embodiments may be performed by thermal oxidation, thermal nitridation, or chemical vapor deposition. Needless to say, many options are available.

Returning to the embodiment shown in FIG. 5, ONO stacks 52 are typically formed to have an electrically measure oxide equivalent thickness in a range of 100–500 angstroms. The gate dielectric layer 51 is typically at least as thick as the tunnel dielectric layer 21, which is a specific type of gate dielectric layer.

Figure 6:
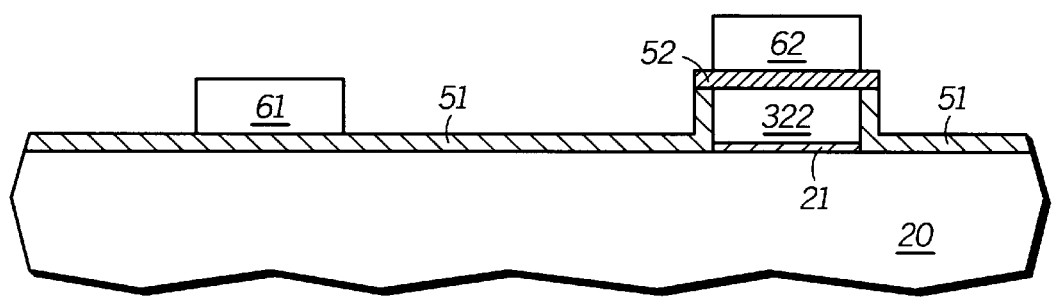
FIGS. 6 and 7 include a cross-sectional view and a plan view, respectively, of the substrate of FIGS. 4 and 5 after forming control gates.
Figure 7:
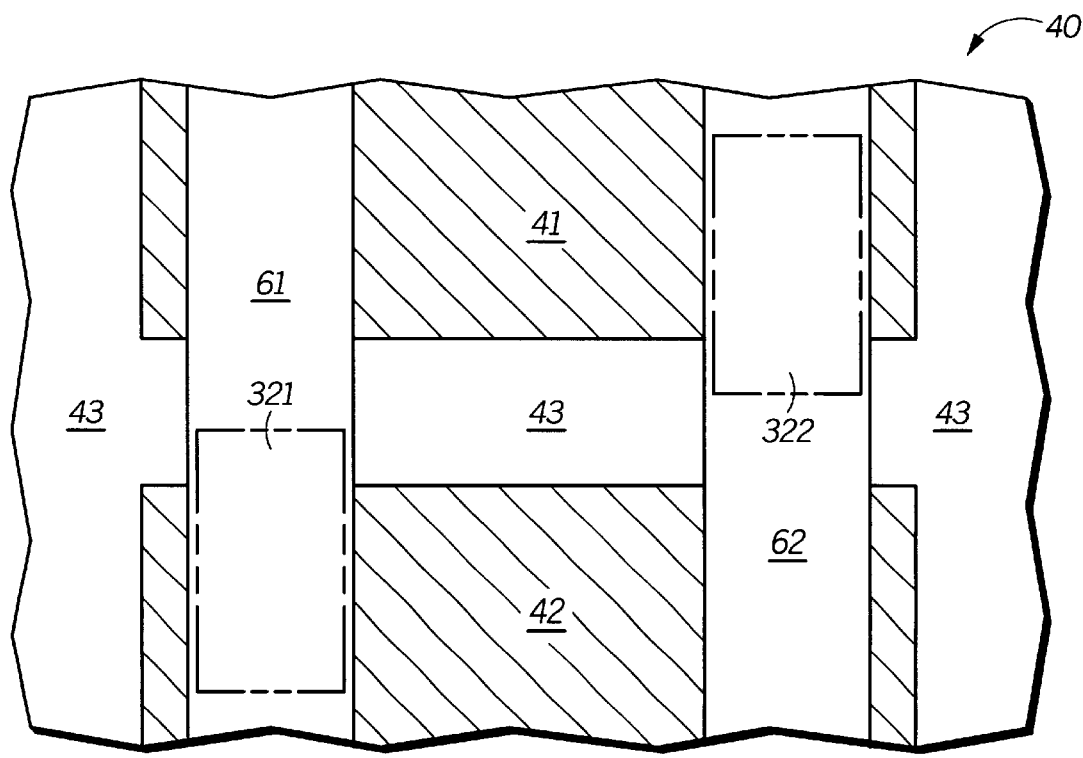

A silicon-containing or metal-containing conductive layer (i.e., doped polysilicon, doped amorphous silicon, refractory metal silicide, or the like) is then deposited over the gate dielectric layer 51 and ONO stacks 52 and is patterned to form control gate lines 61 and 62, which are conductive members. The control gate lines 61 and 62 generally correspond to CG1 and CG2 of FIG. 1. A portion of control gate line 61 is the gate 113 for the transistor 11, and another portion of the control gate line 61 is the control gate 123 for the transistor 12. Similarly, a portion of control gate line 62 is the control gate 143 for the transistor 14, and another portion of the control gate line 62 is the gate 153 for the transistor 15. FIGS. 6 and 7 illustrate cross-sectional and plan views, respectively, after formation of the control gate lines 61 and 62. As can be seen in FIG. 6, the left-hand control gate line 61 overlies the gate dielectric layer 51 and has a portion that does not overlie either of the floating gates 321 and 322. The right-hand control gate line 62 overlies ONO stack 52 and the floating gate 322. FIG. 7 illustrates the positional relationships between the control gate lines 61 and 62, the floating gates 321 and 322, the active region 43, and the field isolation regions 41 and 44. As can be seen in FIG. 7, the control gate lines 61 and 62 are formed parallel to one another and extend in a direction from the top of the figure to the bottom of the figure. The floating gates 321 and 322 are shown with line-dash-dash-line notations and lie underneath the control gate lines 61 and 62, respectively. Although FIG. 7 illustrates the floating gates 321 and 322 to be narrower than their corresponding control gate lines 61 and 62, the floating gates 321 and 322 may be the same width or even wider than their overlying control gate lines 61 and 62. Note that the control gate lines 61 and 62 overlie portions of the active regions 43 that are not covered by the floating gates 321 and 322. The combination of the floating gates and control gates subsequently form four transistors. These four transistors correspond to transistors 11, 12, 14, and 15 in FIG. 1.

Figure 8:
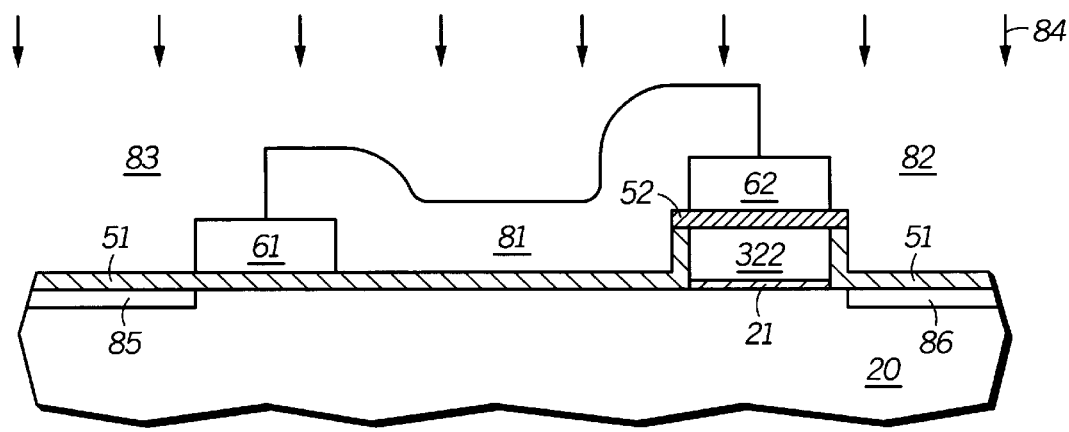
FIG. 8 includes a cross-sectional view of the substrate of FIGS. 6 and 7 during an ion implant doping step.

A masking member 81 is formed over the portion of the active region 43 that lies between the control gate lines 61 and 62 to protect that portion of the active region 43 during an ion implantation step as shown in FIG. 8. Openings 82 and 83, which are adjacent to the masking member 81, allow ions (shown as arrows 84) to penetrate into the substrate 20 beneath the openings 82 and 83. The ion implant is performed with an n-type dopant to a dose of at least 1E15 ions per square centimeter to form doped regions 85 and 86. After the dopant is activated, the doping concentration of regions 85 and 86 will be at least 1E19 atoms per cubic centimeter to allow ohmic contacts to be formed to regions 85 and 86. The masking layer 81 is then removed.

Figure 9:
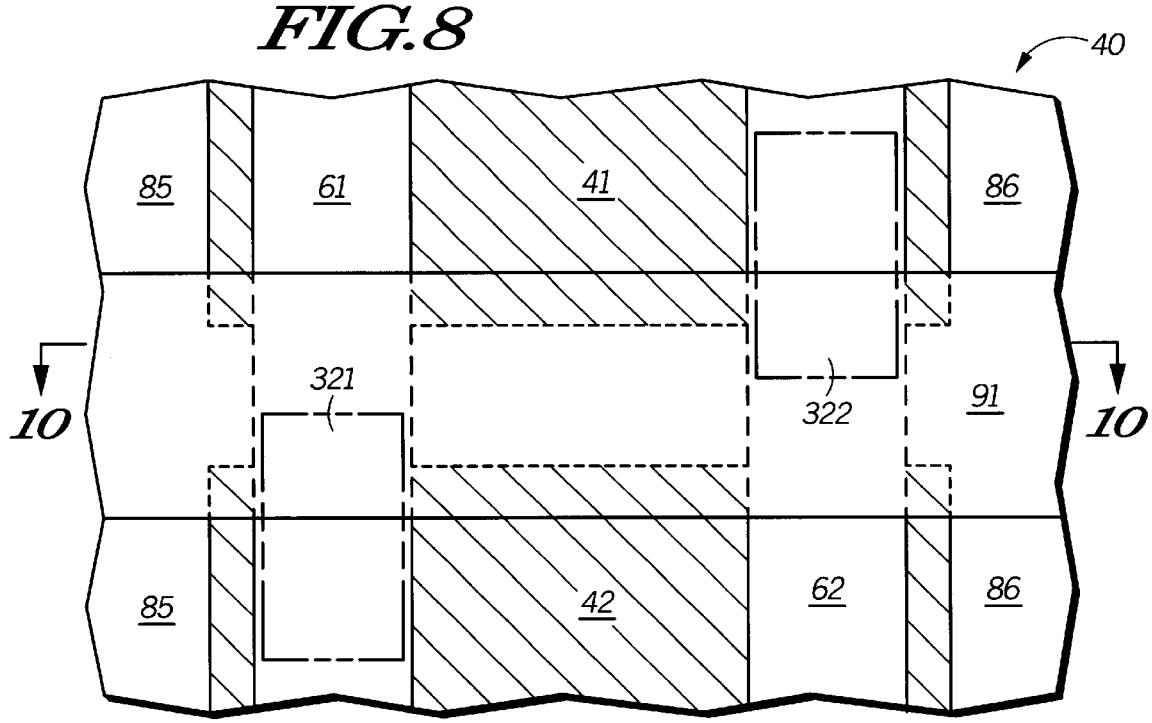
FIGS. 9 and 10 include a plan view and a cross-sectional view, respectively, of the substrate of FIG. 8 after forming a select gate.
Figure 10:
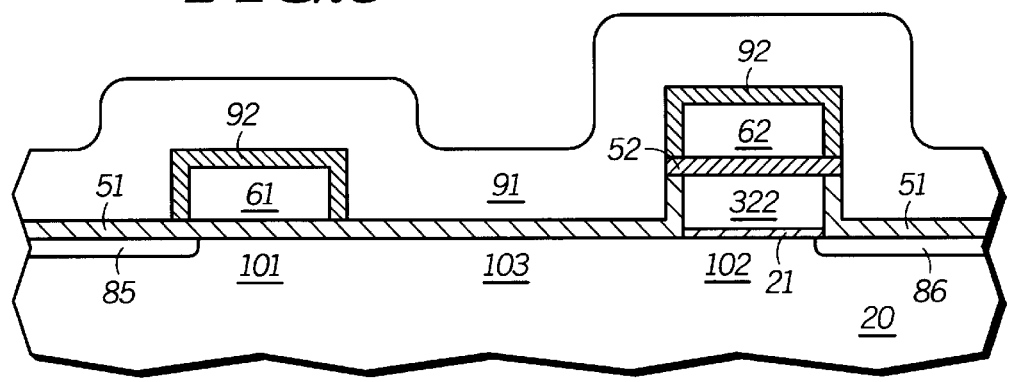

Referring to FIGS. 9 and 10, a thin insulating layer 92 is formed adjacent to the exposed surfaces of the control gate members 61 and 62. The insulating layer 92 may be thermally grown oxide or chemically deposited oxide. In an alternative embodiment, insulating layer 92 may include silicon nitride. After forming the insulating layer 92, another conductive layer is deposited and patterned to form a select gate 91, which is a conductive member. The select gate 91 may include at least one silicon-containing or metal-containing material (i.e., doped polysilicon, doped amorphous silicon, refractory metal silicide, or the like).

FIG. 9 includes a top view of the nonvolatile memory structure 40 at this point in the process. Positional relationships between various portions of the structure are seen in FIG. 9. Various insulating and dielectric layers are not shown in FIG. 9 for simplicity reasons. The upper most layer at this point in the process is the select gate 91 that laterally extends from side-to-side in FIG. 9 and has edges that illustrated by solid lines. Control gate lines 61 and 62 are the next highest layer and have portions that lie beneath the select gate 91. As can be seen in FIG. 9, the lengths of the control gate lines 61 and 62 are generally perpendicular to the length of the select gate 91. The edges of the control gate lines 61 and 62 that underlie the select gate 91 are illustrated by medium length dashed lines.

Floating gates 321 and 322 underlie the control gate lines 61 and 62, respectively. The edges of the floating gates 321 and 322 are illustrated by line-dash-dash-line designations. Field isolation regions 41 and 42 underlie portions of the select gate member 91. The edges of the field isolation regions 41 and 42 that underlie the select gate member 91 are illustrated by a short length dashed line in FIG. 9. Note that although portions of field isolation regions 41 and 42 are covered by select gate 91 are not normally visible, hatching lines for field isolation regions 41 and 42 are extended beneath the select gate 91 to more clearly illustrate the edge of the field isolation regions 41 and 42. Note that regions 85 and 86 actually underlie portions of the select gate member 91 near the edges of FIG. 9.

FIG. 10 includes a cross-sectional view at the sectioning lines in FIG. 9. The nonvolatile memory structure 40 has a channel region that lies near the primary surface of the substrate 20 and between the regions 85 and 86. The channel region is that portion of the substrate near the primary surface that is defined by the field isolation regions 41 and 42 (seen in FIG. 9) and the doped regions 85 and 86. The channel region includes five portions, of which three portions 101–103 are shown in FIG. 10. Each of the five portions acts as a channel region for one of the transistors 11–15. Portion 101 underlies the control gate line 61. Portion 102 underlies both the control gate line 62 and the floating gate 322. Portion 103 lies between the portions 101 and 102. Portion 101 is the channel region of MOS transistor 11, portion 102 is the channel region of the floating gate transistor 14, and portion 103 is the channel region of the MOS transistor 13. Two other portions (not shown in FIG. 10) are channel regions of transistors 12 and 15. The memory structure 40 is capable of storing two bits of data.

Programming and Erasing

The split-channel nonvolatile memory structure 40 may be programmed by source-side hot electron injection and erased by tunneling. The parameters for programming, erasing, and reading transistor 14 of FIG. 1 are given in the table below.

TABLE 1

Programming, erasing, and reading parameters for transistor 14. All parameters are expressed in volts.

| | BL1 | CG1 | SG | CG2 | BL2 | Subst. |
|---|---|---|---|---|---|---|
| Program 14 | 0 | 5 | 1.5 | 10 | 5 | 0 |
| Erase 12 and 14 | 5 | −10 | 0 | −10 | 5 | 0 |
| Read 14 | 0 | $V_{DD}$ | $V_{DD}$ | 0 | 1 | 0 |

During programming, CG1 is at a potential of about 5 volts. MOS transistor 11 is turned on because CG1 is at a potential significantly higher than the threshold voltage of MOS transistor 11. Because transistors 11 and 12 are electrically connected in parallel, the programming state of floating gate transistor 12 (programmed or erased) does not significantly impact the programming of floating gate transistor 14. SG is at a potential of about 1.5 volts. As such, MOS transistor 13 is at a potential slightly higher than its threshold voltage. For example, assume that the threshold voltages of the MOS transistors 11, 13, and 15 are about 0.9 volt. The MOS transistor 13 is weakly turned on compared to MOS transistor 11.

Most of the resistance within channel regions 101 and 103 is controlled by the resistance within channel region 103. The potential at the right-hand side of channel region 103 (as shown in FIG. 10) may be about 0.5 volt during programming of floating gate transistor 14. CG2 is at a potential of about 10 volts. Therefore, both floating gate and MOS transistors 14 and 15 are on. Under these conditions, a relatively high electric field is formed near the edges of channel regions 102 and 103. Hot electrons may be generated at this location because of the relatively high electrical field. Hot electrons may be injected into the floating gate 322 of floating gate transistor 14 because CG2 is at a potential of about 10 volts. This programming mechanism is typically called source-side hot electron injection.

Flash erasing may be performed by tunneling electrons from the floating gates 321 and 322 to the doped regions 85 and 86, respectively. In alternate embodiments, floating gates 321 and 322 may be erased separate from one another. In that case, the floating gate that is not to be erased will have its overlying control gate line and adjacent doped region either at about ground potential or electrically disconnected. Keep in mind that a memory array typically includes many other memory structures similar to the one shown in the figures. When floating gate 322 is being erased, all other floating gates (not shown) that underlie control gate member 62 and adjacent to doped region 86 will also be erased.

During reading of floating gate transistor 14, CG1 and SG are at a potential of about VDD, which is typically between about 1.8–5.0 volts, although a lower potential, such as 0.9 volt, may also be used. BL2 and the doped region 86 at about 1 volt. BL1 and CG2 are at about zero volts. Under these conditions, MOS transistors 11 and 13 are on, and MOS transistor 15 is off. Because transistors 11 and 12 are electrically connected in parallel, the programming state of floating gate transistor 12 does not significantly affect the reading of floating gate transistor 14. A sense amplifier may be coupled to BL2 to determine the programming state of floating gate transistor 14. If the floating gate transistor 14 is programmed, then the current sensed is relatively low. If the floating gate transistor 14 is erased, then the current sensed is relatively high.

Programming and reading of floating gate transistor 12 is similar to the parameters shown in Table 1 except that the potentials for BL1 and BL2 are switched and the potentials for CG1 and CG2 are switched.

The programming, erasing, and reading options used are not limited to those listed above. The potentials actually used may be within about 2 volts of those described above. Other methods of programming, erasing, and reading may be possible.

Benefits of the Embodiment

The present invention includes several benefits. The nonvolatile memory structure 40 is less susceptible to read disturb errors compared to a conventional dual-bit nonvolatile memory structure. More specifically, the nonvolatile memory structure 40 has two pairs of two transistors in parallel. Each pair includes an MOS transistor and a floating gate transistor. Reading of one of the floating gate transistors will not program the other floating gate transistor. An unintentional programming during reading is called a "read-disturb" error. In the present invention, MOS transistor 11 is on when floating gate transistor 14 is read, and MOS transistor 15 is on when floating gate transistor 12 is read. CG1 is at a potential of about 5 volts when the floating gate transistor 14 is read.

Compare this with a prior art dual-bit nonvolatile memory structure that would have transistors similar to transistor 12–14 connected in series between doped regions similar to doped regions 85 and 86. MOS transistors equivalent to transistors 11 and 15 are not present. In order to read the prior art dual-bit nonvolatile memory structure equivalent to floating gate transistor 14, the structure's equivalent to CG1 is at a potential of about 12 volts to ensure that current flows through the channel region of the equivalent to floating gate transistor 12, regardless of whether the floating gate transistor 12 is programmed or erased. At this high potential, electrons may tunnel from the equivalent to doped region 85 to the equivalent of floating gate 321. The floating gate transistor that is not being read may reach an indeterminate state (between programmed and erased) or may become programmed. Such a condition in unacceptable with any memory structure.

In the present invention, CG1 is at a potential of about 5 volts or less when floating gate transistor 14 is read. The potential is not high enough to cause electrons to tunnel from the doped region 85 to floating gate 321. Therefore, read disturb problems of the prior art are virtually eliminated by this embodiment.

Another benefit of the present invention is that its relative size is small for a five transistor layout. The layout takes advantage of overlying three layers (floating gate, control gate, and select gate) in a unique combination. Such a combination allows the five transistors to be formed without doped regions between the transistors. The nonvolatile memory structure 40 can store two bits of data (one for each floating gate).

Nonvolatile memories structures programmed in accordance with the present invention may actually have a relatively low bit line current and programming time. Half of the bits within the nonvolatile memory structures 40 along select gate member 91 may be programmed simultaneously. For example, assume that 128 memory structures similar to the one shown in the figures are associated with the select gate member 91. The doped regions 85 and 86 alternate along the length of the select gate 91 and are source/drain regions. For floating gate transistors 14 that are to be programmed, CG2s are placed at about 10 volts, and for the floating gate transistors 14 not to be programmed, CG2s are either at about zero volts or electrically disconnected. This method of programming is typically referred to as a "page write." Other than CG2s, the parameters in Table 1 are used during the programmed. In this manner, up to 128 floating gates are programmed during one sequence that may take ten milliseconds or less. Therefore, the programming time per floating gate (bit) is less than 100 microseconds. Programming by tunneling typically takes at least one millisecond per bit to program.

The current flowing into the doped regions 86 during programming is limited by the current flowing through the channel region 103. In other words, MOS transistors 13 are only weakly turned on and act as a resistor to limit current flow. Therefore, programming current per bit during a page write is typically less than a microampere and is typically in a range of 1–100 nanoamperes. Compare this with conventional hot electron injection that may have a programming current per bit of about 400–700 microamperes.

The benefits of such programming described above allow a lower programming current to be used compared to conventional hot electron injection and may be programmed in about the same time as a hot electron injected. A conventional drain-side hot electron injection either requires a second power supply or a relatively large power supply. Second power supplies are generally undesired with semiconductor devices. A large charge pump occupies too much valuable area within a semiconductor device. The embodiments of the present invention do not require a second power supply, and a relatively small charge pump may be used because the programming current per bit is typically less than 100 nanoamperes.

Another benefit of the present invention is that it may be used with conventional fabrication processing steps. No special processing steps or marginal etch steps are needed to form the structure. The process may be used or slightly adjusted to form periphery transistors while the nonvolatile memory structures 40 are being formed.

In the foregoing specification, the invention has been described with reference to specific embodiments thereof. However, it will be evident that various modifications and changes may be made thereto without departing from the broader spirit or scope of the invention as set forth in the appended claims. Accordingly, the specification and drawings are to be regarded in an illustrative rather than a restrictive sense.

What is claimed is:

1. A nonvolatile memory circuit for storing a plurality of bits of data comprising:
   a first transistor having a gate, a first source/drain, and a second source/drain;
   a second transistor having a control gate, a floating gate, a first source/drain, and a second source/drain, wherein:
   the first source/drains of the first and second transistors are coupled to each other; and
   the gate of the first transistor and the control gate of the second transistor are coupled to each other;
   a third transistor having a gate, a first source/drain, and a second source/drain, wherein the second source/drains of the first and second transistors and the first/source drain of the third transistor are coupled to each other;
   a fourth transistor having a control gate, a floating gate, a first source/drain, and a second source/drain; and
   a fifth transistor having a gate, a first source/drain, and a second source/drain, wherein:

the first source/drains of the fourth and fifth transistors are coupled to each other;

the second source/drains of the third, fourth and fifth transistors are coupled to one another; and the control gate of the fourth transistor and the gate of the fifth transistor are coupled to each other.

2. The circuit of claim 1, wherein:

the first source/drains of the first and second transistors are coupled to a first bit line; and the first source/drains of the fourth and fifth transistors are coupled to a second bit line.

3. The circuit of claim 1, wherein the circuit is capable of storing two bits of data.

4. The circuit of claim 1, wherein the circuit includes only two floating gates.

5. The circuit of claim 1, wherein the circuit includes only five transistors.

6. The circuit of claim 1, wherein the circuit includes only n-channel transistors.

7. A nonvolatile memory structure for storing a plurality of bits of data, wherein the nonvolatile memory structure includes only five transistors and comprises:

a semiconductor substrate;

a first doped region and a second doped region, wherein the first and second doped regions lie within the substrate and are spaced apart from each other;

a channel region lying within the substrate and between the first and second doped regions;

a first gate dielectric layer overlying the substrate;

a first floating gate and a second floating gate overlying the substrate, wherein the first and second floating gates:

are spaced-apart from each other; and each of the first and second floating gates does not extend across all of the channel region in any direction;

an intergate dielectric layer overlying the first and second floating gates;

a first conductive member and a second conductive member, wherein:

the first conductive member lies adjacent to the first floating gate and overlies a first portion of the channel region that is not covered by the first or second floating gates;

the first conductive member is a gate for a first transistor and a control gate for a second transistor;

the second conductive member lies adjacent to the second floating gate and overlies a second portion of the channel region that is not covered by the first or second floating gates; and the second conductive member is a control gate for a third transistor and a gate for a fourth transistor; and the first and second conductive members are spaced apart from each other; and a third conductive member overlying a third portion of the channel region that lies between the first and second conductive members, wherein the third conductive member is a select gate for the memory structure.

8. A nonvolatile memory structure for storing a plurality of bits of data, wherein the nonvolatile memory structure has only five transistors and comprises:

a semiconductor substrate;

a first doped region and a second doped region, wherein the first and second doped regions lie within the substrate and are spaced apart from each other;

a channel region lying within the substrate and between the first and second doped regions;

a first floating gate and a second floating gate, wherein:

the first floating gate overlies a first portion of the channel region;

the second floating gate overlies a second portion of the channel region;

are spaced-apart from each other; and each of the first and second floating gates does not extend across all of the channel region in any direction;

a first conductive member and a second conductive member, wherein:

the first conductive member lies adjacent to the first floating gate, is a gate for a first transistor, and is a control gate for a second transistor;

the second conductive member lies adjacent to the second floating gate, is a control gate for a third transistor and, and is a gate for a fourth transistor; and the first and second conductive members are spaced apart from each other; and a third conductive member overlying a third portion of the channel region, wherein the third conductive member is a select gate for the memory structure.

* * * * *